United States Patent [19]

Davis et al.

[11] Patent Number: 4,945,246
[45] Date of Patent: Jul. 31, 1990

[54] TRI-DEFLECTION ELECTRON BEAM SYSTEM

[75] Inventors: Donald E. Davis; Cecil T. Ho, both of Poughkeepsie; Jon E. Lieberman, Montgomery, all of N.Y.; Hans C. Pfeiffer, Ridgefield, Conn.; Maris A. Sturans, Poughquag, N.Y.

[73] Assignee: International Business Machines Corporation, Armonk, N.Y.

[21] Appl. No.: 328,379

[22] Filed: Mar. 24, 1989

[51] Int. Cl.⁵ ............................................. H01J 37/302
[52] U.S. Cl. .................................... 250/492.2; 250/398
[58] Field of Search ................ 250/492.22, 492.2, 398, 250/492.23

[56] References Cited

U.S. PATENT DOCUMENTS

| | | | |
|---|---|---|---|
| 4,199,689 | 4/1980 | Takigawa | 250/492 |
| 4,376,249 | 3/1983 | Pfeiffer | 250/396 |
| 4,390,789 | 6/1983 | Smith et al. | 250/492.2 |
| 4,465,934 | 8/1984 | Westerberg | 250/398 |
| 4,514,638 | 4/1985 | Lischke et al. | 250/492.2 |
| 4,544,846 | 10/1985 | Langner | 250/396 |
| 4,692,579 | 9/1987 | Saitow et al. | 250/492.2 |

OTHER PUBLICATIONS

The EBES4 Electron–Beam Column, by M. G. Thomson et al., (AT&T Bell Laboratories, Murray Hill, N.J. 07974).
Recent Advances in Electron–Beam Lithography for the High-Volume Production of VLSI Devices by Hans C. Pfeiffer, (Reprinted form IEEE Transactions on Electron Devices, vol. ED-26, No. 4, 4/79).
EBES4-A New Electron–Beam Exposure System by D. S. Alles et al., (AT&T Bell Laboratories, Murray Hill, N.J. 07974).
Electron Optical Column for High Speed Nanometric Lithography by N. Saitou et al., (Central Research Lab. Hitachi Ltd., Tokyo 185, Japan).

Primary Examiner—Jack I. Berman
Attorney, Agent, or Firm—Graham S. Jones, II

[57] ABSTRACT

A three-stage E-beam deflection system employs breaking the entire field to be scanned into clusters and subfields. The scanning provided by the first stage of deflection which scans within the entire field is rectilinear and discontinuous with the scan stopping in the center of each of the clusters where an exposure is to be made, and scanning is the same within each cluster from sub-field to sub-field. The scanning within a cluster by the second stage stops in the center of each sub-field where exposure is to be made. The third stage uses high speed electrostatic deflection to provide scanning with a vector scanning mode within the sub-field being scanned.

13 Claims, 5 Drawing Sheets

TRI-DEFLECTION ELECTRON BEAM SYSTEM

BACKGROUND OF THE INVENTION

1. Field of the Invention

This invention relates to electron beam projection (E-beam) systems and more particularly to an E-beam system which exposes targets to write both large and small patterns on a target, i.e. work piece.

2. Related Art

E-beam exposure systems have been employed for micro-fabrication of large scale integrated circuits on semiconductor substrates. Such systems are useful for writing patterns on radiation sensitive material usually composed of photoresist, deposited on targets such as substrates in the form of semiconductor wafers or photolithographic masks. The E-beam exposes the radiation sensitive material and a pattern is developed on the wafer or in the mask.

The E-beam system must balance the need for maximum throughput of work pieces with the ever increasing demands of industry for smaller and smaller microscopic patterns. The typical E-beam system of this kind includes an E-beam source, a deflection system for deflecting the E-beam in a predetermined pattern and magnetic projection lenses for focussing the E-beam.

After the E-beam is deflected and focussed the beam reaches the target, i.e. work piece. In the past, the target has been subdivided into larger areas and smaller areas within which different E-beam deflection stages deflect the E-beam within larger areas on the target known as fields and smaller areas on the target known as subfields.

An example of an early version of such an arrangement of fields and sub-fields is found in commonly assigned U.S Pat. No. 4,494,004 of Mauer et al, entitled "Electron Beam System", which describes a method of using a shaped-beam E-beam system with magnetic deflection yokes for the sequential, rectilinear scanning of sub-fields, and electric deflection plates for vector scanning within each sub-field. Square apertures in plates provide a shaped spot.

Another aspect of this type of system is that it is desirable to eliminate E-beam projection system aberration. In U.S. Pat. No. 4,376,249 of Pfeiffer et al entitled "Variable Axis Electron Beam Projection System", a variable axis E-beam projection system is described in which the electron optical axis is shifted so as to be coincident with the deflected E-beam at all times. Shifting the E-beam optical axis has the advantages that it (1) causes the E-beam to land perpendicular to the target and (2) eliminates lens aberration caused by off-axis E-beams. In particular a projection lens is arranged so that upon pre-deflection of the E-beam by deflection yokes, the electron optical axis of the lens shifts to be coincident with the deflected beam.

Pfeiffer et al 4,376,249 also describes a system in which the E-beam is deflected and a magnetic projection lens, which has a rotational symmetry, focuses the deflected beam. A pair of correction yokes positioned within the bore of the projection lens produce a magnetic compensation field proportional to the first derivative of the axial magnetic field strength distribution lens to shift the electron optical axis of the projection lens so that the axis of the E-beam remains coincident with the shifted electron optical axis and so the E-beam lands perpendicular to the target.

U.S. Pat. No. 4,544,846 of Langner et al, commonly assigned, entitled "Variable Axis Immersion Lens Electron Projection System", known as "vail", is an improvement on U.S. Pat. No. 4,376,249 above. It also shifts the E-beam as does the '249 patent, while eliminating rapidly changing fields, eddy currents, and stray magnetic fields in the target area. In the case of the Langner et al system, the vail lens includes an upper pole piece and a lower pole piece each of which includes a non-zero bore section, a zero bore section, and an opening between the zero bore section and the lower pole piece for inserting the target into the lens. The magnetic compensation yoke is positioned within the bore of the upper pole piece to produce a magnetic compensation field which is proportional to the first derivative of the axial magnetic projection field.

Co-pending U.S. patent application Ser. No. 142,035 of Groves et al for "Telecentric Sub-Field Deflection with Vail" now U.S. Pat. No. 4,859,856, describes a vail system similar to that of Langner et al, supra, wherein there are upper and lower deflection stages with the upper stage comprising electrostatic deflection plates for deflecting a pattern within a sub-field. The lower deflection stage is comprised of magnetic yokes which deflect the beam within a field. The electrostatic deflection plates are located well above the back focal plane of the vail lens in order to accommodate the vail system (or its equivalent.)

In Groves et al, placing the electrostatic plates in the vail lens is not possible, since the space available near the back focal plane of the vail lens is extremely limited.

A paper by Saitou et al "Electron Optical Column for High Speed Nanometric Lithography" to Hitachi, describes a three stage deflection system which includes a third electrostatic deflector which employs a round gaussian spot which must be scanned in small raster to expose a rectangular area, which is accomplished in a shaped beam system with a single exposure. FIG. 2 of Saitou et al shows the three stages with the three writing methods including "Variable Gaussian 3-Stage", "Variable Shaped 2-Stage" and "Fixed Gaussian 1-Stage". It shows a wafer with chips broken up into fields and sub-fields.

An article by Thompson, Liu, Collier, Carroll, Doherty and Murray in "The EBES4 Electron-Beam Column" of AT&T Bell Laboratories describe a triple deflection system with a magnetic deflection telecentric first stage followed by two electrostatic stages.

Alles et al, "EBES4 A New Electron-Beam Exposure System" J. Vac. Sci Technol. B5(1) January/February 1987 states that the variably shaped beam is not used in the EBES4 system, but that small fixed spots are used as the building blocks.

U.S. Pat. No. 4,390,789 of Smith et al for "Electron Beam Array Lithography System Employing Multiple Parallel Array Optics Channels and Method of Operation" describes a two stage deflection system with both fine and coarse deflection stages. The system uses a fly's eye system with lenslets. It includes two channels and no shaped beam. A matrix of discrete lenses is employed and the axis is not shifted.

U.S. Pat. No. 4,514,638 of Lischke et al entitled "Electron-Optical System with Variable-Shaped Beam for Generating and Measuring Microstructures" has three electrical deflection systems AE1, AE2 and AE3, the second and third of which return the E-beam to its optical axis. The second and third systems are not related to positioning the beam on the target.

U.S. Patent No. 4,465,934 of Westerberg et al for "Parallel Charged Particle Beam Exposure System" shows use of a double octupole deflection system in FIG. 2 of that patent.

OBJECTS OF THE INVENTION

It is an object of this invention to improve the throughput (wafers exposed per hour) of an electron beam lithography system while maintaining or improving the resolution and/or pattern placement accuracy of the system. Pattern placement accuracy is a necessary, but not sufficient requirement for overlay (pattern to pattern accuracy from one level to another) and stitching (matching of patterns of fields, clusters or sub-fields at the same level.)

A system with the ability to write large fields has the advantages of covering all four corner registration marks within the same deflection field resulting in superior overlay without stitching errors. If the deflection field cannot reach the four registration marks, a mechanical x-y stage move must be made to read those marks, which introduces errors into the process. Also, large fields result in a reduced number of mechanical x-y stage moves to expose a wafer, resulting in higher throughput. The introduction of a vail lens into an electron beam lithography system provides a higher resolution over a large deflection field than that of non-vail systems. However, a system with only the shaped spot and double deflection configuration operating over a large field would have an undesirably low throughput and could not take full advantage of the large field, high resolution afforded by the vail lens.

SUMMARY OF THE INVENTION

In accordance with this invention, a triple deflection, shaped spot system solves the problem of throughput and taking advantage of the vail lens by reducing the time required to deflect the beam to various exposure sites on the target plane or wafer. (Conversely, it should be observed that without a system such as the vail lens and its high resolution over a large field, a triple deflection, shaped spot system would be of no value.)

Further in accordance with this invention a system with three-stage deflection is provided. This system employs a scheme of fields and sub-fields in which the fields and sub-fields are scanned as in the past in the Pfeiffer, Langner et al and Groves et al applications. In addition each field to be scanned is broken into both clusters within each field and sub-fields within each cluster. The scanning provided by the first stage of deflection which scans within an entire field is rectilinear and discontinuous with the scan of the field, stopping in the center of each of the clusters where an exposure is to be made. Scanning is the same within each cluster from sub-field to sub-field. The scanning within a cluster by the second stage stops in the center of each sub-field where exposure is to be made. The third stage uses high speed electrostatic deflection to provide scanning with a vector scanning mode within the sub-field being scanned. The beam being scanned is a shaped beam.

DETAILED DESCRIPTION OF THE INVENTION

Figure 3:
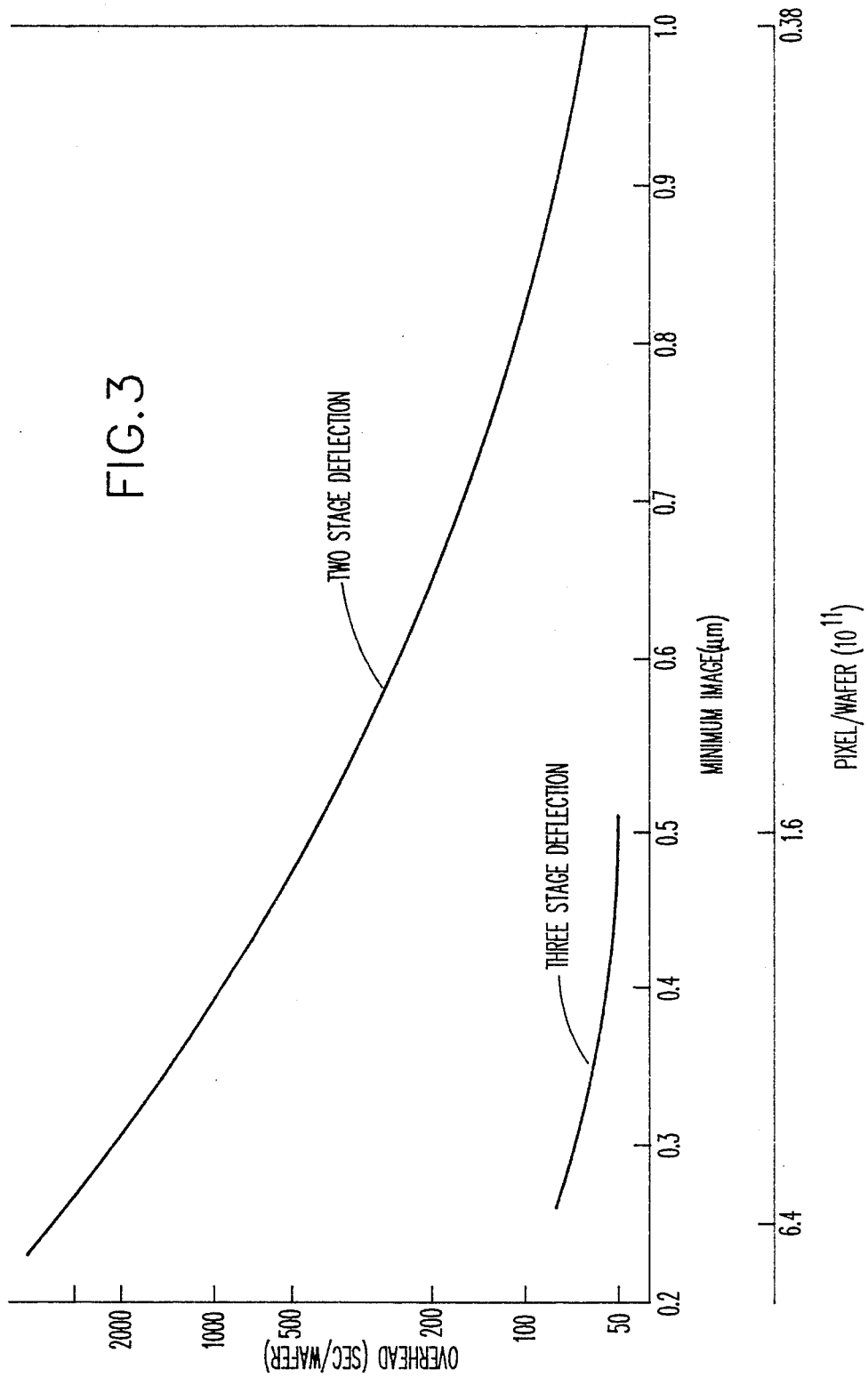
FIG. 3 is a graph of the overhead time expended in exposing wafers in seconds per wafer as a function of minimum image size and the inverse of pixels per wafer.

All deflection systems have certain limitations which involve trade-offs between speed, range and accuracy. An increase in stepping speed in any deflection will increase throughput by reducing the time required to move from one exposure to the next. As deflection range is increased, the stepping speed for a given accuracy will decrease approximately as the square of the value of the range. We have found that throughput can be increased by the addition of a third deflection stage. In such a triple deflection system, the number of moves of the slower (major) deflection to the center of a cluster is significantly fewer than the number of moves to the center of each sub-field for a double deflection system. Given a system with a fixed field and sub-field size, the triple deflection system can provide as much as a factor of four improvement in throughput over a double deflection system, as illustrated by FIG. 3 which shows the typical throughput improvement that can be achieved. FIG. 3 shows the overhead, i.e. time per wafer as a function of minimum image size and the inverse of pixels per wafer. The advantage of the three stage deflection is obvious for minimum image size which is the equivalent to the maximum number of pixels per wafer shown in FIG. 3. It can be seen that as the trend to smaller minimum image sizes progresses, that the divergence increases, favoring the three stage deflection over the two stage deflection system.

Figure 4A:
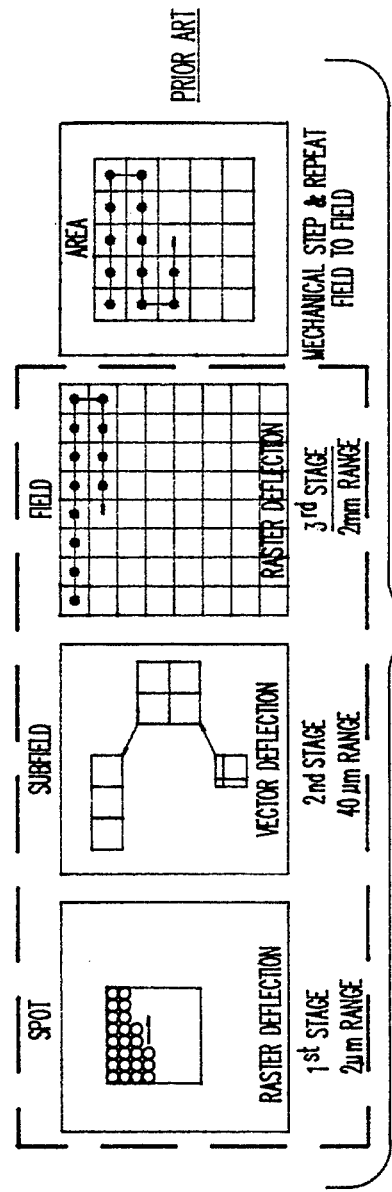
FIG. 4A is a graphic representation of the four levels of scans required to produce a spot with a prior art system.

FIG. 4A shows a four step system that uses three stages of deflections, and which also employs a Gaussian spot in the first stage under the control of raster deflection to form a pattern shown as a square in this case, since squares are patterns usually required in masks for semiconductor manufacturing. The gaussian spot system writes a single pixel of information on the workpiece to be exposed at a single moment in time.

Figure 4B:
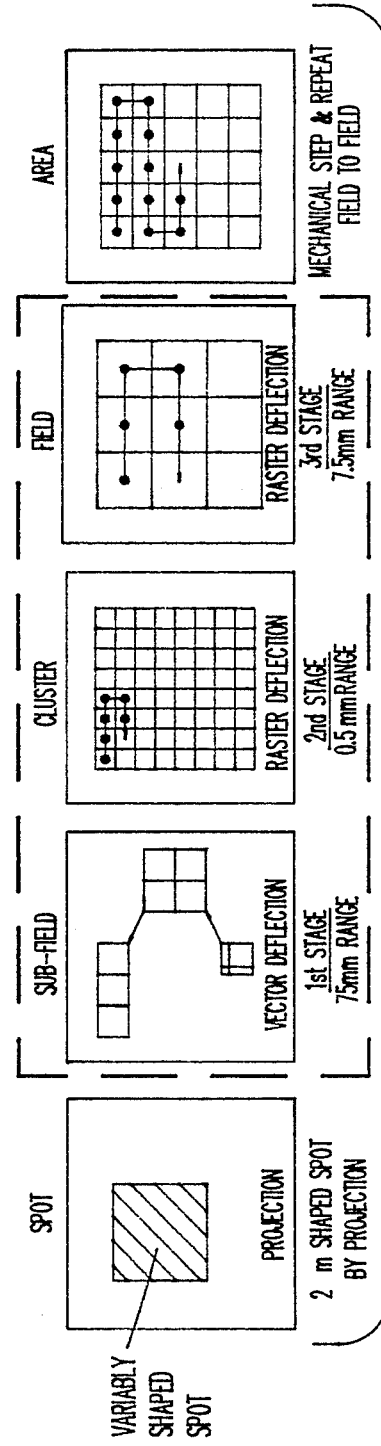
FIG. 4B is a similar graphic representation to FIG. 4a with the substitution of the new three stages of deflection and the variably shaped spot of the instant invention.

On the other hand, considering a system incorporating this invention, a shaped beam system as illustrated in FIG. 4B on the left end of the diagram, writes the equivalent of 25 to 100 pixels in parallel. The gaussian spot system of FIG. 4A may use its raster deflection system to create rectilinear shapes that are equivalent to a single shaped spot.

A shaped spot is preferably provided by a shaped-beam E-beam system as described in Mauer et al above, U.S. Pat. No. 4,494,004, commonly assigned. FIG. 3 of the Mauer et al patent shows such a system.

Referring to FIG. 4A, the four separate operations shown are as follows:

1. Writing of a spot, in a larger sub-field, which is within a larger field, which is within a larger area.
2. Scanning a sub-field from spot to spot.
3. Scanning a field from sub-field to sub-field.
4. Stepping and repeating from field to field within an area on a wafer. In FIG. 4A, the first stage of deflection provides raster deflection of the E-beam to form a square spot. In FIG. 4B, the shaped beam forms the square spot without any deflection. In FIG. 4A, the deflection provided by the second stage deflects the beam from spot to spot within a sub-field. In FIG. 4B, the first stage provides vector deflection of the beam from spot to spot within a sub-field. In stage 4A the deflection provided by the third stage is a raster deflection from sub-field to sub-field within a field. In FIG. 4B, the second stage of deflection provides raster deflection within a cluster from sub-field to sub-field. In FIG. 4A, the largest scans are provided by the mechanical step & repeat drive across an "area" from field to field. At a comparable level, the third stage of E-Beam deflection provides raster deflection from cluster to cluster within a field. Then in the highest level scan the mechanical step and repeat scan goes from field to field within an area on a substrate, i.e. a wafer.

In summary, the triple deflection system of FIG. 4A is different from the three stage system of this invention which also includes vail and the shaped spot projection to replace the first stage raster deflection with first stage vector scan from sub-field to sub-field.

The foregoing and other objects, features and advantages of the invention will be apparent from the more particular description of the preferred embodiments of the invention which follows.

DESCRIPTION OF AN EMBODIMENT OF THE INVENTION

Figure 1:
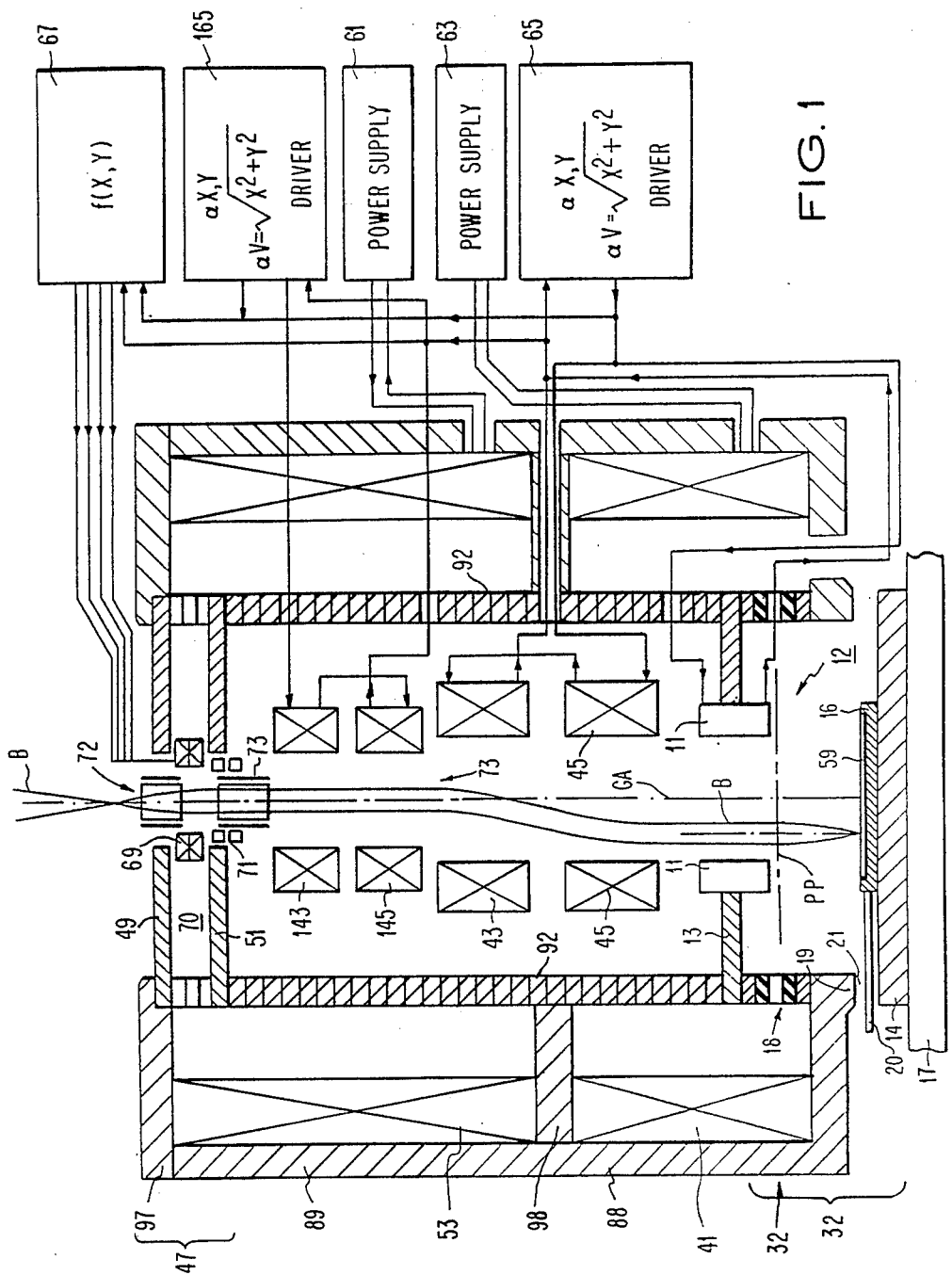
FIG. 1 is a schematic half-sectional drawing illustrating a three stage deflection E-beam system in accordance with this invention incorporating a vail lens.

Referring to FIG. 1, a schematic half-sectional drawing illustrates an E-beam projection system in accordance with this invention which incorporates the vail (Variable-Axis-Immersion-Lens) system of U.S. Pat. No. 4,544,846, of Langner et al, supra, and the telecentric embodiment of an E-beam system with a vail lens as described in Groves et al U.S. patent application Ser. No. 142,035, supra, for "Telecentric Sub-Field Deflection with Vail" (both of which are incorporated herein by reference).

Figure 2:
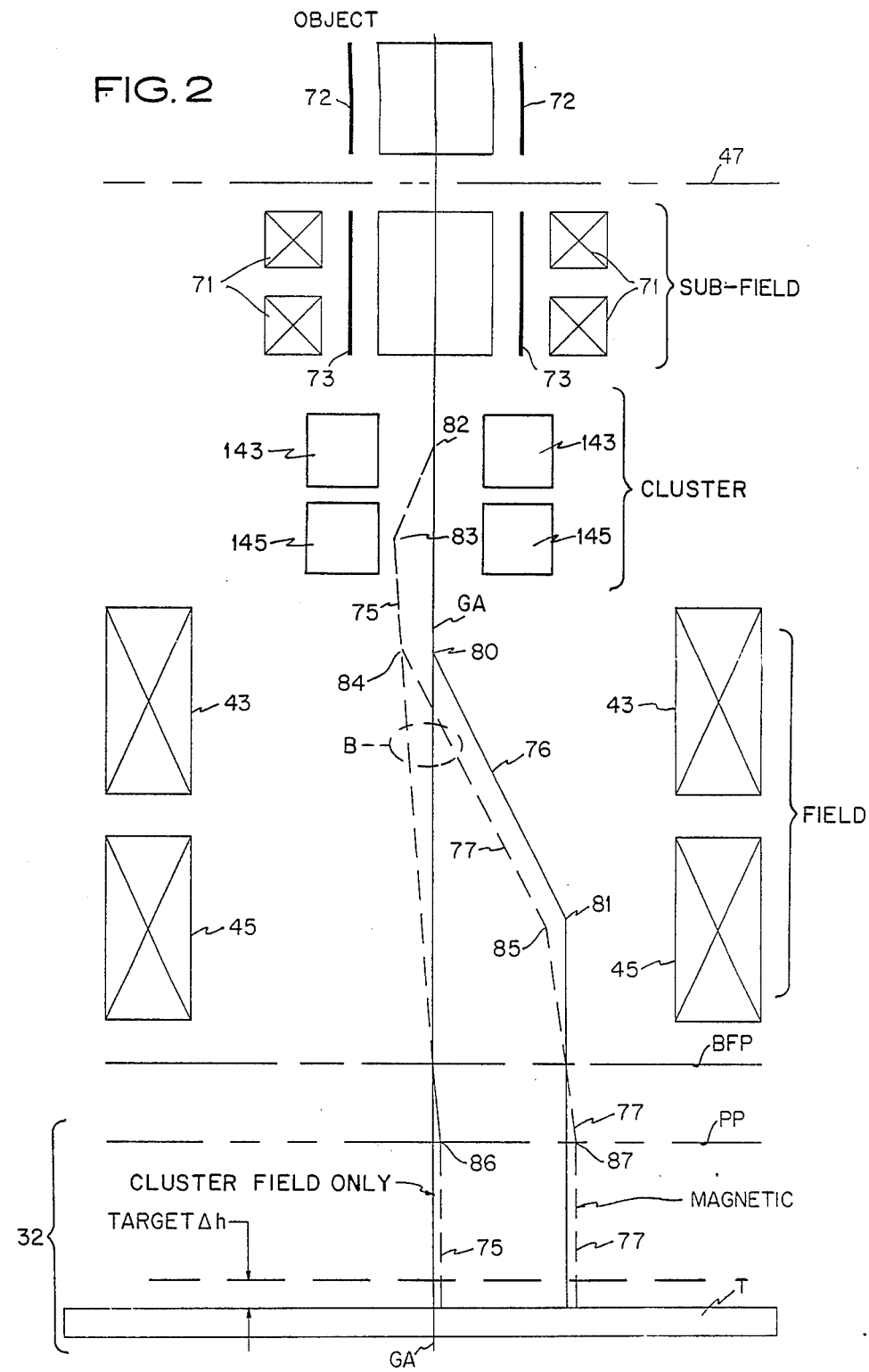
FIG. 2 is a schematic drawing of the deflectors and yokes of FIG. 1, illustrating the deflection of the E-beam path produced by the three stages of deflection relative to the geometrical axis of the system.

FIG. 2 is a schematic drawing of E-beam system of FIG. 1 with the deflectors and yokes and the cluster and major deflecting axes and E-beam paths produced by the deflectors and yokes, illustrated relative to the geometrical axis GA of the system.

Referring to FIG. 1, the apparatus shown includes a magnetic circuit of magnetic materials which house coils 41 and 53. A cylinder 88 at the base of the E-beam apparatus supports a lower annular magnetic disk 98. Above the magnetic disk is the upper magnetic cylinder 89. Resting on top of magnetic cylinder 89 is upper annular magnetic disk 97. Inside the magnetic cylinders 88 and 89 and disks 97 and 98 is a stack of annular magnetic rings 92, which are coaxial with the cylinders 88 and 89 and the disks 97 and 98. That structure leaves spaces for the excitation coil 41 of the projection lens inside lower magnetic cylinder 88, below disk 98 and outside the stack of magnetic rings 53 of the collimating lens inside cylinder 89, and above disk 98 and below disk 97, with the stack of magnetic rings 92 forming the inside wall.

At the top of the projection system in FIG. 1, the system includes a magnetic collimating lens 47 with non-zero bore annular pole pieces 49 and 51, and an excitation coil 53 for the collimating lens 47. When excited by coil 53, lens 47 collimates the E-beam B to provide telecentric capability.

UPPER DEFLECTION STAGE

Within the opening in annular pole piece 49 is the upper beam deflection stage (sub-field deflection) comprising a set of X, Y multipole electrostatic deflection plates 72, preferably dodecapole (12 plates per set) multipole deflectors, as will be understood by those skilled in the art. Within and below the central opening in annular pole piece 51 is a second set of X, Y multipole electrostatic deflection plates 73, preferably dodecapole (12 plates per set) multipole deflectors. The deflection plates 72 and 73 can be located elsewhere, but must precede the lower deflection stage, i.e. main deflection yokes 43 and 45, which provide the main magnetic field for controlling deflection of beam B.

CLUSTER FIELD (2 DEFLECTORS)

Unlike the previous systems where the area to be exposed is broken down only into fields and sub-fields, in accordance with this invention an additional division of the fields into clusters is provided. The clusters are next broken down into sub-fields. The deflectors 143 and 145 shown as magnetic deflection yokes are located in the same plane or below the electrostatic sub-field deflectors 72 and 73. Deflectors 143 and 145 must be located above the major field deflection yokes 43 and 45, which provide the main magnetic field.

Deflectors 143 and 145 can be selected from either electrostatic deflection elements or magnetic yokes. In the case of electrostatic elements, deflectors 143 and 145 can be superimposed on the sub-field deflectors in a multipole (i.e. 20 pole) configuration.

LOWER DEFLECTION STAGE

The lower deflection stage comprises a pair of main deflection yokes 43 and 45 which predeflect the projected E-beam B to the left as illustrated, as an example, in FIG. 1. The upper deflection yoke 43 and the lower deflection yoke 45 are both preferably toroidal magnets. Stigmators 71 which are located below the collimating lens 47, provide astigmatism correction of the E-beam B while the dynamic focus coil 69 is located in the pole pieces 49 and 51 of the collimating lens 47.

PROJECTION LENS

Projection lens 32 includes an upper magnetic path comprising non-zero bore, upper pole piece 13 and a lower magnetic path formed of a return path section 19 and a lower pole piece, i.e. zero bore section 14. One plane of the projection lens 32 is the principal plane PP which is the principal plane on the object side of the lens 32, with the upper pole piece 13 above it and the lower pole piece 14 below it. Projection lens 32 is a thick lens, so it also has a principal plane on the image side of the projection lens 32, which is not illustrated in FIG. 2, since it is not of special significance in terms of the invention herein.

Excitation coil 41 activates projection lens 32 and produces magnetic field lines which run from upper pole piece 13 to lower pole piece elements 14 via return path 19. The vail system includes a vail assembly 12 which comprises the combination of the projection lens 32 and the magnetic compensation yoke 11. The embodiment in Groves et al is employed in the system of the instant application with the addition of deflection means between the electrostatic deflection plates and the lower stage of Groves et al. Shielding leg 18 includes alternating magnetic and nonmagnetic sections so that the magnetic lines of force from yoke 11 are isolated from penetration of windings 41. Also shielding leg 18 reduces the amount of magnetic field which is shorted away from the center of the lens 32.

The magnetic circuit of the projection lens 32 is shaped at section 19 and the lower pole piece 14 to permit flux to pass to zero bore section 14 with a minimal amount of reluctance and fringing. The single magnetic compensation yoke 11 provides a magnetic field which is proportional to the first derivative of the axial magnetic field produced by the projection lens 32.

FIG. 1 also illustrates the target holding, handling and stepping means. Target 59 is mounted on a target holder 16 for providing accurate registration of the target within the E-beam projection system. A target handler arm 20 inserts the target 59 into vail assembly 12 via opening 21 therein. A target stepper table 17 is employed for X-Y movement of the target 59.

In the system of FIG. 1, astigmatism and field curvature are corrected using dynamic correction. The block 61 is a power supply for excitation coil 53. Block 63 is a power supply for excitation coil 41. Driver 65 represents a computer-controlled driver for excitation of deflection yokes 43 and 45. Deflection yokes 43 and 45 have two sets of magnetic deflection coils which cooperate to deflect the E-beam B in both the X and Y directions in accordance with the usual practice. Deflection yokes 43 and 45 are typically comprised of a plurality of toroidal coils.

Driver 65 also activates magnetic compensation yoke 11 which consists of a pair of X-Y magnetic deflection yokes. Magnetic compensation yoke 11 may comprise a simple saddle coil because of its smaller outer diameter for the same inner diameter as compared to a toroidal yoke of the same deflection sensitivity. The X-Y current sent to magnetic compensation yoke 11 is proportional to the X-Y currents sent to deflection yokes 43 and 45 and are supplied by the same driver 65.

Driver 165 represents a computer-controlled driver for excitation of deflection yokes 143 and 145. Deflection yokes 143 and 145 have two sets of magnetic deflection coils which cooperate to deflect the E-beam B in both the X and Y directions in accordance with the usual practice. Deflection yokes 143 and 145 are typically comprised of a plurality of toroidal coils. Driver 165 also helps to activate magnetic compensation yoke 11 which consists of a pair of X-Y magnetic deflection yokes. The X-Y current sent to magnetic compensation yoke 11 is proportional to the X-Y currents sent to deflection yokes 143 and 145 and may be supplied by the same driver 165.

Referring now also to FIG. 2, in the first approximation, the field of the compensation yoke 11 compensates the radial component of the magnetic field produced by the projection lens 32 along a magnetic axis line parallel to the geometrical (symmetry) axis GA of lens 32, but displaced laterally from the geometrical axis GA. The magnetic axis line defines the shifted electron optical axis, because the radial field component resulting from the superposition of fields of the compensation yoke 11 and the projection lens 32 is zero there. The position of the shifted electron optical axis is scanned synchronously with the current in the compensation yoke 11 and the main deflection yokes 43 and 45. The displacement of the optical axis from the symmetry axis GA of lens 12 is proportional to the current in the compensation yoke 11 and the deflection yokes 43 and 45.

In a case in which no sub-field or cluster field deflection signals are applied, the position of the E-beam B in the immersion lens 12 coincides precisely with the shifted electron optical axis. In addition the E-beam B enters the immersion lens assembly 12 as a parallel, collimated bundle of rays, representing an object at infinity. Two conditions of the E-beam which result in the total elimination of blurring effects due to electrons of differing energies in the beam being deflected by differing amounts are as follows:

(1) The beam axis coincides with the shifted electron optical axis, (The beam axis is the central ray of the E-beam B from the top to the bottom of the E-beam B); and (2) The object is at infinity.

This blurring is referred to in the literature as transverse chromatic aberration. Since transverse chromatic aberration is the leading limitation on the performance of more conventional deflectors, the elimination of this aberration is considered to be of fundamental importance.

In a case in which sub-field or cluster field deflection is applied, the position of the E-beam B in the immersion lens assembly 12 deviates slightly from the ideal condition described above. Because the sub-field deflection may be viewed as a small perturbation on the main-field deflection, this deviation from the ideal condition has negligible effect, and contributes negligible aberration and blurring.

As explained at Col. 7 lines 54–68 of the Langner et al U.S. Pat. No. 4,544,846 supra on the vail system, the dynamic, astigmatic correction coil assembly 71 and the dynamic focus coil 69 produce magnetic fields which compensate for astigmatism, and curvature of field respectively. The dynamic correction coil assembly is preferably a dual quadrupole element driven by the driver 67. Driver 67 receives an input signal proportional to the currents which are sent to the X and Y main deflection yokes 43 and 45 and cluster deflection yokes 143 and 145 and it generates a signal, by means of techniques well known to those skilled in the art.

In order to maintain normal landing (telecentricity) for electrostatic sub-field and cluster field deflection, the system must provide for E-beam B to cross a plane containing at any given time a rocking point which must be positioned to be located in the Back Focal Plane (BFP) of the vail lens assembly 12 shown in FIG. 1. The BFP is comprised of the various back focal points on the object side of the projection lens 32 which are all located in the same plane, i.e. the back focal plane BFP. Since the rocking point at the BFP is shifting laterally with the optical axis of a vail system, or any other equivalent off axis deflection system employed in accordance with this invention, it is not directly accessible to the sub-field or cluster field deflection elements such as 72, 73 and 143, 145. This is so because the elements such as 72, 73 and 143, 145 cannot be placed within the main deflection yoke openings in toroidal yokes 43 and 45, since the E-beam B is scanned too far off from the geometrical center and produces severe deflection aberrations. However, double deflection stages 72 and 73 and 143 and 145 (which are placed before the magnetic yokes of the variable axis deflection lens system in accordance with this invention as shown in FIG. 1) can rock the E-beam B at the back focal plane BFP maintaining the E-beam B telecentric, so it lands on the work piece or target T (59) at a normal, i.e. vertical angle. Note that the second electrostatic deflector 73 must compensate for the refraction of the collimating lens 70, shown in FIG. 1.

A point source of rays emanating from the back focal point will come out of the projection lens 32 as a parallel bundle. This is the definition of back focal plane BFP. Similarly, any ray which intersects the lens or optical axis at the back focal point will emerge from the projection lens 32, parallel to the optical axis, but in general displaced from the axis. By "rocking" the E-beam B about the back focal point the system generates a cone of rays emanating from this point. These rays all emerge from the projection lens parallel to the optical axis, but displaced.

The phrase "emerge from the projection lens" 32, is equivalent to impacting the target writing surface 59. It is a key aspect of a preferred embodiment of this invention that the rays impact the writing surface 59 at normal incidence; i.e., parallel to the optical axis. Only in this condition is the placement of the beam on the target 59 insensitive to the height of the target 59, avoiding the errors in height deviation which are indicated by delta h. This is of great benefit, because the local height of the target is difficult to control. The wafer is typically tilted, out of flat, etc.

The "back focal plane" BFP is that plane which contains the back focal point for all paths of the beam B, and the BFP is perpendicular to the optical axis and axis GA. The planes containing the rocking points and the back focal plane BFP must coincide in position (i.e. be superimposed) so that the condition of telecentricity can be achieved. To get the rocking point to coincide with the back focal point, we adjust the ratio of the electrical strengths of the upper and lower sub-field and cluster field deflectors respectively with upper deflectors 72 and 73 on the one hand and sub-field deflectors 143 and 145 on the other hand below them. This moves the rocking point up and down along the optical axis. We know that the two points coincide when the beam impacts the target at normal incidence. In practice this is verified by scanning the beam over two separate test targets which are at different heights. The system is run as a scanning electron microscope (SEM) in this setup. The beam impacts the target at normal incidence when the SEM magnification is the same for the two targets. This is the same as saying that the beam landing position is totally insensitive to target height.

The double deflection sub-field and cluster field stages also minimize the off-axis displacement in the projection lens 32, (relative to the geometrical axis GA) thereby minimizing deflection non-linearity resulting from spherical aberration. For a given point on the target 59, the magnetic deflection is illustrated by the solid line 76 in FIG. 2. The path of beam B labelled "cluster field only" is traversed under the control of the deflection elements 143 and 145, and it is shown by dotted line 75, which starting at the top of FIG. 2 bends to the left at point 82 in response to upper element 143, bends to the right at point 83 in response to lower element 145, and bends to a vertical alignment with target 59 at point 86 in response to the projection lens 32.

The path of E-beam B in response to the magnetic deflection alone is shown in FIG. 2 by solid line 76, which bends down to the right at point 80 in response to the upper magnetic deflection yoke 43 and bends to a vertical downward alignment at point 81 in response to the lower deflection yoke 45.

When the cluster field deflection line 75 and the magnetic line 76 are superimposed the result in FIG. 2 is the combined dotted line 77, which bends at points 84, 85 and 87, analogously to points 80, 81, and 86 respectively, as described above. Since both the E-beam B and the optical axis are shifted in parallel and in coincidence, the double deflection cluster field design is not affected. The analogous ray tracing pertains to the electrostatic sub-field deflection.

Figure 5:
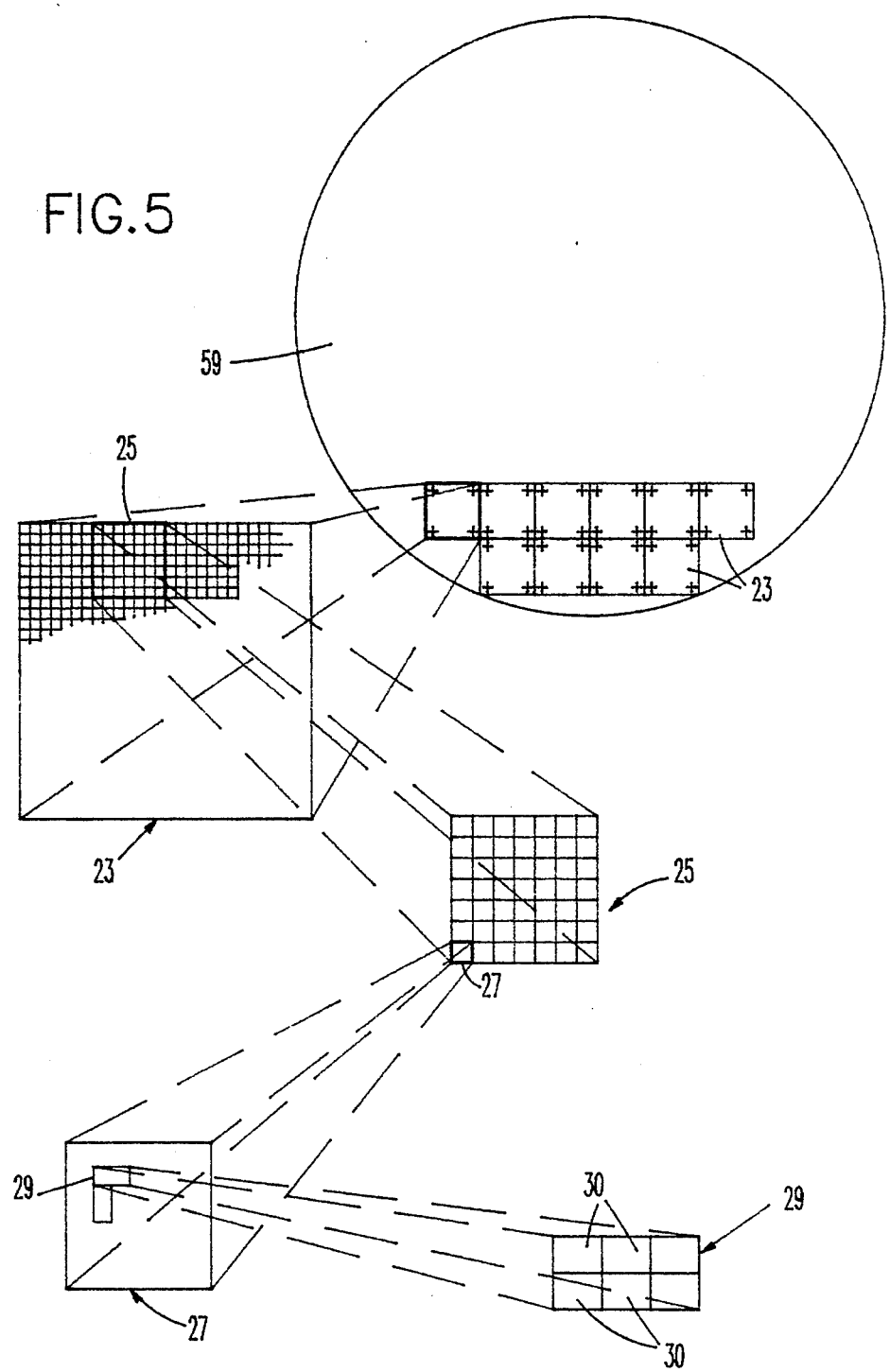
FIG. 5 is a schematic representation of the hierarchy of three stages of beam deflection plus the use of the shaped beam which are employed in the implementation of the invention illustrated in FIGS. 1 and 2.

Referring to FIG. 5, the process of this invention employs a three stage deflection system used in conjunction with a shaped spot and a vail lens in an electron-beam lithography system. FIG. 5 is a graphic representation of the hierarchy of deflection stages plus the use of the shaped beam which are employed in the implementation of the invention illustrated in FIGS. 1 and 2. A field, which is often an entire semiconductor chip is broken into clusters and sub-fields. A target 59 in the form of a semiconductor wafer is shown with a few of the fields 23 shown on the wafer with registration marks in their corners.

The scanning across a target from a first field 23 to an adjacent field 23 is performed by the mechanical step and repeat apparatus. The scanning of the first deflection stage is employed to scan the fields 23; and such scanning is rectilinear and discontinuous with the scan of each field 23 stopping in the center of each of the clusters 25 within a field 23. The scanning within the clusters 25 by the second deflection stage is performed at a higher speed, but it is also rectilinear and discontinuous with the scans stopping in the center of each of the sub-fields 27. The third and highest speed deflection stage uses vector scanning to place the beam within a rectangle 29 within a sub-field 27. Within the rectangle 29, a sequence of shaped spots 30 is exposed with spots 30 combining to form a pattern being written, which in this case is the rectangle 29.

INDUSTRIAL APPLICABILITY

This invention is applicable to the construction of an electron beam system for the exposure of lithographic resist layers in manufacture of masks for chips or direct exposure of semiconductor material for manufacture of chips, such as chips for personal computers, minicomputers, large scale computers and other data processing equipment.

What is claimed is:

1. Apparatus for scanning a shaped electron beam onto a target area, said area being subdivided into fields, said fields being subdivided into clusters, said clusters being subdivided into sub-fields, said sub-fields being subdivided into spots, comprising:

(a) means for scanning said electron beam in a said area such that said electron beam scans one field, and said beam is paused in this and subsequent ones of said fields;

(b) means for scanning said electron beam in a said field such that said electron beam scans one cluster and is paused in this and subsequent ones of said clusters; and (c) means for scanning said electron beam in said one cluster such that said electron beam scans one sub-field and is paused in this and subsequent ones of said sub-fields, (d) means for vector scanning said shaped electron beam from a said spot to another said spot within a said sub-field, whereby scanning is performed hierarchically from field to field within an area, from cluster to cluster within a field, and from sub-field to sub-field within a cluster.

2. A three stage, shaped E-beam projection system comprising:
(a) a variable axis E-beam projection system,
  (1) said E-beam projection system providing means for projecting a shaped-spot electron beam with a rectangular configuration,
  (2) said projection system including means for scanning a field to be exposed,
  (3) said field having been divided into clusters within said field,
  (4) said clusters having been divided into sub-fields within each of said clusters, and
  (5) said sub-fields having been divided into spots within said sub-fields,
(b) said projection system also including first stage means for providing deflection of said beam over said field in a discontinuous row-by-row scan of said field,
  (1) said first stage means comprising a first deflection system for scanning said beam in a first modified raster scan extending over a field,
  (2) said first modified raster scan proceeding from the center of one cluster position to the next cluster position, one-by-one, with said beam temporarily arresting its scan as said beam reaches the center of each current cluster to permit completion of operations of succeeding stages in said current cluster,
(c) second stage means for providing deflection of said beam to sub-field centers within a said cluster in a second discontinuous row-by-row scan of said cluster,
  (1) said second stage means comprising a second deflection system for scanning said beam in a second modified raster scan extending over at least a portion of said cluster,
  (2) said second modified raster scan proceeding from the center of one sub-field position to the next sub-field position one-by-one with said beam temporarily arresting its scan as it reaches the center of each current sub-field,
  (3) said scan being arrested to permit completion of operations of the following stage in scanning in said current sub-field,
(d) third stage means for providing deflection of said beam within a sub-field to which it is directed by said second stage means, said third stage means comprising a third deflection system for providing vector deflection of said beam to a series of particular loci upon a target within a sub-field, whereby said projection system projects said variably shaped spot on the target as deflected by said first second and third stages in a sequential manner.

3. A system in accordance with claim 2 wherein said projection system includes a variable axis immersion lens.

4. A system in accordance with claim 3 wherein deflection means are positioned above said variable axis immersion lens for maintaining telecentricity of said beam.

5. A three stage, shaped E-beam projection system in accordance with claim 2 wherein said third stage means comprises an electrostatic deflection system for providing said vector deflection of said beam to a series of particular loci upon a target within a sub-field, whereby said projection system projects said variably shaped spot on the target from said projection system as deflected by said first second and third stages in a sequential manner and, whereby a rapid three stage scanning system provides the accuracy of a shaped spot exposure with the alignment afforded by a variable axis lens electron beam projection system.

6. A system in accordance with claim 5 wherein said projection system includes a variable axis immersion lens.

7. A system in accordance with claim 6 wherein deflection means are positioned above said variable axis immersion lens for maintaining telecentricity of said beam.

8. A three stage, shaped E-beam projection system including,
(a) a variable axis, vail, E-beam projection system for providing an E-beam with a shaped spot,
  (1) said E-beam projection system including means for scanning a field to be exposed,
  (2) said field having been divided into clusters within said field,
  (3) said clusters having been divided into sub-fields within each of said clusters, and
  (4) said sub-fields having been divided into spots within said sub-fields, with said E-beam projection system providing a beam projecting a variably shaped-spot with a rectangular configuration within a sub-field,
(b) said projection system also including first, second and third stage stage means for providing deflection of said beam,
  (1) said first stage means being adapted for deflection of said beam to stop in the center of a cluster in said field during the scanning of said cluster by the remaining stages,
  (2) said first stage deflection proceeding from the center of one field position to the next field position, one-by-one, with said beam temporarily arresting its scan as said beam reaches the center of each current cluster which said beam reaches in said field to permit completion of operations of succeeding stages in said current cluster,
(c) second stage means for providing deflection of said beam to sub-field centers within a said cluster,
  (1) said second stage means providing scanning of said beam from the center of one sub-field position to the next sub-field position one-by-one with said stage temporarily arresting its scan of said beam as said beam reaches the center of each current sub-field it reaches in said cluster,
  (2) said second stage scan being arrested to permit completion of operations of the following stage in scanning in said current sub-field,
(d) third stage means for providing deflection of said beam within a sub-field to which it is directed by said second stage means, said third stage means comprising a deflection system for providing deflection of said beam to a series of particular loci upon a target within a sub-field, whereby said projection system projects said variably shaped spot on the target from said projection system as deflected by said first second and third stages in a sequential manner and, whereby a rapid three stage scanning system provides the accuracy of a shaped spot exposure with the alignment afforded by a variable axis lens electron beam projection system.

9. A method of scanning a shaped electron beam onto a target area, said area being subdivided into fields, said field being subdivided into clusters, said clusters being subdivided into sub-fields, said sub-fields being subdivided into spots, comprising the steps of:
   (a) scanning said electron beam in a said area such that said electron beam scans one field, and said beam is paused in this and subsequent ones of said fields;
   (b) scanning said electron beam in a said field such that said electron beam scans one cluster and is paused in this and subsequent ones of said clusters, and
   (c) scanning said electron beam in said one cluster such that said electron beam scans one sub-field and is paused in this and subsequent ones of said sub-fields;
   (d) means for vector scanning said shaped electron beam from a said spot to another said spot within a said sub-field,
      whereby said method of scanning is performed hierarchically from field to field within an area, from cluster to cluster within a field, and from subfield to sub-field within a cluster.

10. A method of employing a variable axis E-beam projection system, for scanning an electron beam onto a target area, said area being subdivided into fields, said fields being subdivided into clusters, said clusters being subdivided into sub-fields, said sub-fields being subdivided into spots, comprising the steps of:
   (a) scanning said electron beam in a said area such that said electron beam scans one field, and said beam is paused in this and subsequent ones of said fields;
   (b) scanning said electron beam in a said field such that said electron beam scans one cluster and is paused in this and subsequent ones of said clusters; and
   (c) scanning said electron beam in said one cluster such that said electron beam scans one sub-field and is paused in this and subsequent ones of said sub-fields;
   (d) projecting a shaped-spot electron beam with a rectangular configuration,
   (e) deflecting said beam in a first stage of the deflection process over a said field in a discontinuous row-by-row scan of said field,
      (1) scanning said beam in a first modified raster scan extending over a field, proceeding from the center of one cluster position to the next cluster position, one-by-one,
      (2) temporarily arresting said scanning as said beam reaches the center of each current cluster to permit completion of operations of succeeding stages in said current cluster,
   (f) deflecting said beam in a second stage of the deflection process to sub-field centers within a said cluster in a second discontinuous row-by-row scan of said cluster,
      (1) said second stage means comprising a second deflection system for scanning said beam in a second modified raster scan extending over at least a portion of said cluster,
      (2) said second modified raster scan proceeding from the center of one sub-field position to the next sub-field position one-by-one and arresting as it reaches the center of each current sub-field,
      (3) arresting said scan to permit completion of operations of the following stage in scanning in said current sub-field,
   (g) deflecting said beam in a third stage of the process of deflection within a sub-field to which it is directed during said second stage of deflection, providing vector deflection of said beam to a series of particular loci upon a target within a sub-field,
      whereby said method of scanning is performed hierarchically from field to field within an area, from cluster to cluster within a field, and from subfield to sub-field within a cluster, and said variably shaped spot is projected on the target as deflected during said first second and third stages in a sequential manner.

11. A method in accordance with claim 10 employing a variable axis E-beam projection system comprising a variable axis immersion lens.

12. A method in accordance with claim 10 employing a variable axis E-beam projection system comprising a variable axis immersion lens with means disposed above said variable axis immersion lens for maintaining telecentricity of said beam.

13. A method in accordance with claim 10 employing a variable axis E-beam projection system comprising a variable axis immersion lens with means disposed above said variable axis immersion lens for maintaining telecentricity of said beam, and said beam providing a shaped spot.

* * * * *